United States Patent
Ong et al.

(10) Patent No.: US 7,811,901 B1
(45) Date of Patent: Oct. 12, 2010

(54) METHOD AND EDGE REGION STRUCTURE USING CO-IMPLANTED PARTICLES FOR LAYER TRANSFER PROCESSES

(75) Inventors: Philip James Ong, Milpitas, CA (US); Harry Kirk, Campbell, CA (US); James Andrew Sullivan, Woodside, CA (US)

(73) Assignee: Silicon Genesis Corporation, San Jose, CA (US)

( * ) Notice: Subject to any disclaimer, the term of this patent is extended or adjusted under 35 U.S.C. 154(b) by 140 days.

(21) Appl. No.: 12/315,369

(22) Filed: Dec. 1, 2008

Related U.S. Application Data (60) Provisional application No. 60/992,086, filed on Dec. 3, 2007.

(51) Int. Cl.
*H01L 21/30* (2006.01)
(52) U.S. Cl. ............................ 438/458; 257/E21.568
(58) Field of Classification Search .................. 438/406
See application file for complete search history.

(56) References Cited

U.S. PATENT DOCUMENTS

| 6,482,725 B1 * | 11/2002 | Ishida ..................... 438/528 |
| 6,846,718 B1 * | 1/2005 | Aga et al. ................ 438/406 |
| 6,900,113 B2 * | 5/2005 | Nakano et al. .......... 438/455 |

* cited by examiner

*Primary Examiner*—Chandra Chaudhari
(74) *Attorney, Agent, or Firm*—Townsend and Townsend and Crew LLP (57) ABSTRACT

A method for fabricating a silicon on substrate structure having smooth edge regions. The method includes providing a silicon donor substrate having a surface region and a backside region. A substrate thickness is provided between the surface region and the backside region. The method includes co-implanting a plurality of first particles through the surface region into a vicinity of a cleave region and a plurality of second particles through the surface region into the vicinity of the cleave region. The cleave region defines a thickness of material to be removed between the cleave region and the surface region. The surface region of the silicon donor substrate is joint to a handle substrate to form a coupled substrate structure. The coupled substrate structure is then processed using a thermal treatment process and placed into a cleaving chamber. A cleaving action is initiated at an edge region of the coupled substrate structure to begin to detach the thickness of material at the edge region toward a center region of the thickness of material. The thickness of material is freed from a remaining portion of the coupled substrate structure. In a specific embodiment, the method provides an edge region having an edge profile that is substantially free from particles that can lead to breakage and the like.

24 Claims, 10 Drawing Sheets

METHOD AND EDGE REGION STRUCTURE USING CO-IMPLANTED PARTICLES FOR LAYER TRANSFER PROCESSES

CROSS-REFERENCES TO RELATED APPLICATION

The instant nonprovisional patent application claims priority to U.S. Provisional Patent Application No. 60/992,086, filed Dec. 3, 2007 and incorporated by reference in its entirety herein for all purposes.

BACKGROUND OF THE INVENTION

The present invention relates to the manufacture of substrates. More particularly, the invention provides a technique including a method and a structure for forming multi-layered substrate structures for the fabrication of substrates for semiconductor integrated circuit devices using co-implant and layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

From the very early days, human beings have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, a flat panel display, and others. These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and or brittle materials, such as diamond or glass. The saw operation also cannot be used effectively for the manufacture of microelectronic devices, including integrated circuit devices, and the like.

Accordingly, techniques have been developed to fabricate microelectronic devices, commonly called semiconductor integrated circuits. Such integrated circuits are often developed using a technique called the "planar process" developed in the early days of semiconductor manufacturing. An example of one of the early semiconductor techniques is described in U.S. Pat. No. 2,981,877, in the name of Robert Noyce, who has been recognized as one of the father's of the integrated circuit. Such integrated circuits have evolved from a handful of electronic elements into millions and even billions of components fabricated on a small slice of silicon material. Such integrated circuits have been incorporated into and control many of today's devices, such as computers, cellular phones, toys, automobiles, and all types of medical equipment.

Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Increasing circuit density has not only improved the complexity and performance of integrated circuits but has also provided lower cost parts to the consumer.

Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials. An example of such a process is an ability to make the thickness of the substrate thin after the manufacture of the integrated circuit devices thereon. A conventional process often used to thin these device layers is often called "back grinding," which is often cumbersome, prone to cause device failures, and can only thin the device layer to a certain thickness. Although there have been significant improvements, such back grinding processes still have many limitations.

Accordingly, certain techniques have been developed to cleave a thin film of crystalline material from a larger donor substrate portion. These techniques are commonly known as "layer transfer" processes. Such layer transfer processes have been useful in the manufacture of specialized substrate structures, such as silicon on insulator or display substrates. As merely an example, a pioneering technique was developed by Francois J. Henley and Nathan Chung to cleave films of materials. Such technique has been described in U.S. Pat. No. 6,013,563 titled Controlled Cleaving Process, assigned to Silicon Genesis Corporation of San Jose, Calif., and hereby incorporated by reference for all purposes. Although such technique has been successful, there is still a desire for improved ways of manufacturing multilayered structures.

From the above, it is seen that a technique for manufacturing large substrates which is cost effective and efficient is desirable.

BRIEF SUMMARY OF THE INVENTION

The present invention relates to the manufacture of substrates. More particularly, the invention provides a technique including a method and a structure for forming multi-layered substrate structures for the fabrication of substrates for semiconductor integrated circuit devices using co-implant and layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

In a specific embodiment, the present invention provides a method for fabricating a silicon on substrate structure having smooth edge regions. The method includes providing a silicon donor substrate, which has a surface region, a backside region, and a substrate thickness provided between the surface region and the backside region. The method includes co-implanting a plurality of first particles through the surface region into a vicinity of a cleave region and a plurality of second particles through the surface region into the vicinity of the cleave region to define a thickness of material to be removed between the cleave region and the surface region. In a preferred embodiment, the first particles comprise helium ions and the second particles comprise hydrogen ions. The method includes joining the surface region of the silicon donor substrate to a handle substrate to form a coupled substrate structure. The method includes processing the coupled substrate structure using a thermal treatment process and placing the coupled substrate structure into a cleaving chamber. The method initiates a cleaving action at an edge region of the coupled substrate structure to begin to detach the thickness of material at the edge region toward a center region of the thickness of material. The method removes the thickness of material to free the thickness of material from a remaining portion of the coupled substrate structure. In a preferred embodiment, the method includes providing an edge region of the thickness of material having a edge profile characterized by being free from one or more particles derived from one or more portions of the thickness of material capable of being broken off and causing a defect, the one or more particles having a dimension of greater than about 0.1 micron.

Numerous benefits are achieved over pre-existing techniques using the present invention. In particular, the present invention uses controlled energy and selected conditions to preferentially cleave a thin film of material without a possibility of damage to such film from excessive energy release. This cleaving process selectively removes the thin film of material from the substrate while preventing a possibility of damage to the film or a remaining portion of the substrate. Additionally, the present method and structures allow for more efficient processing using a cleave layer provided in a substrate through the course of semiconductor processing, which may occur at higher temperatures, according to a specific embodiment. In a preferred embodiment, the present method provides an improved edge region, which is smoother and has lower yield loss. In a preferred embodiment, the present method uses a co-implanting technique that causes formation of a smother edge region, which has a edge profile characterized by being free from one or more particles derived from one or more portions of the thickness of material capable of being broken off and causing a defect. In a specific embodiment, the one or more particles has a dimension of greater than about 0.1 micron for silicon material. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

According to the present invention, techniques for manufacture of substrates are provided. More particularly, the invention provides a technique including a method and a structure for forming multi-layered substrate structures for the fabrication of substrates for semiconductor integrated circuit devices using co-implant and layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

Figure 1:
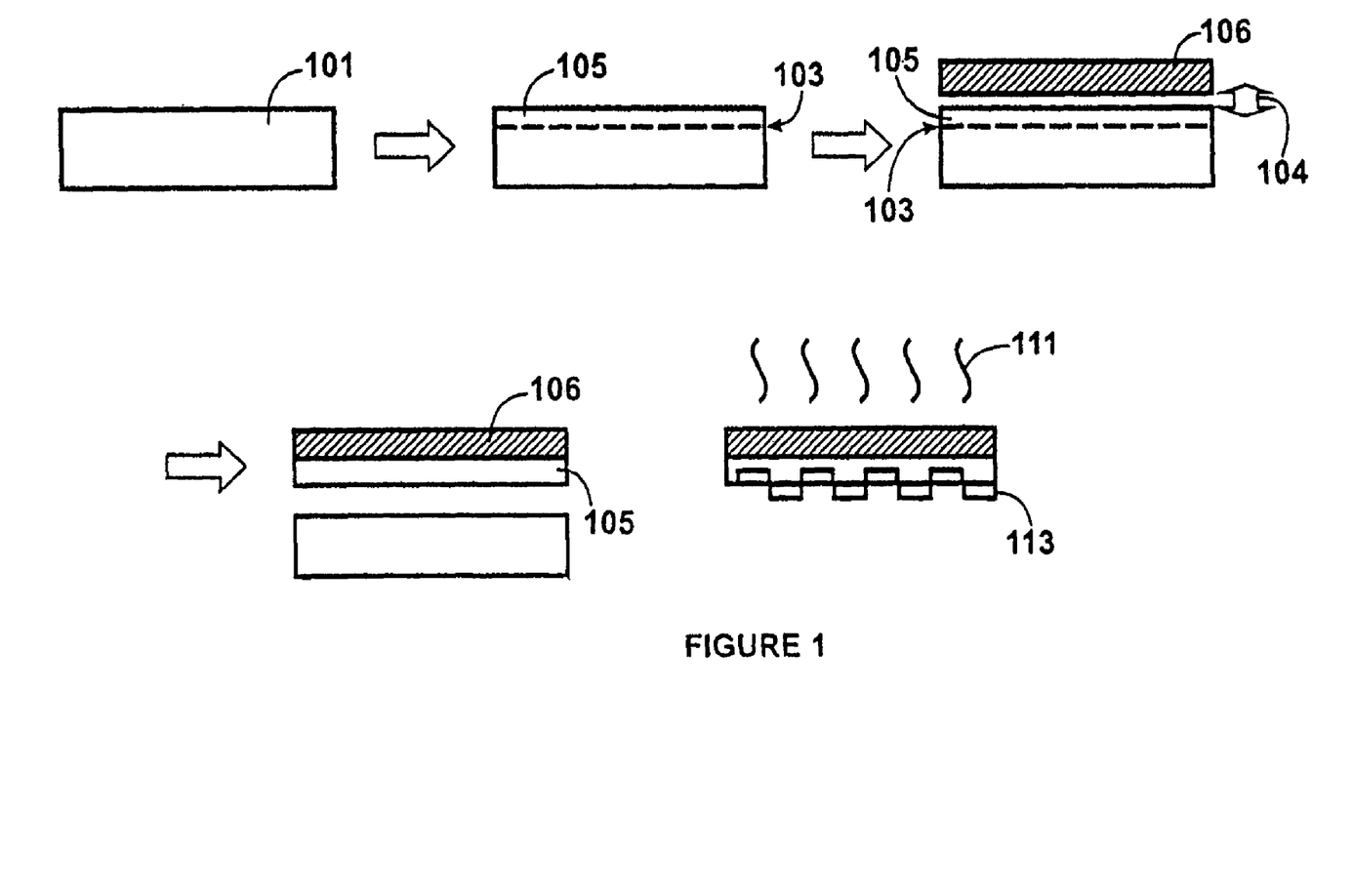
FIG. 1 illustrates an overall simplified method for manufacturing integrated circuits on a layer transferred substrate using co-implantation according to embodiments of the present invention.

Referring to FIG. 1, a method 100 for fabricating integrated circuits on a layer transferred substrate according to embodiments of the present invention may be outlined as follows:

1. Provide a semiconductor substrate 101, e.g., silicon, germanium, a silicon-germanium alloy, gallium nitride, gallium arsenide, silicon carbide, any Group III/V materials, any Group II/VI materials, other alloys, and combinations, and others;
2. Perform a cleaning process on the semiconductor substrate;
3. Form a cleave plane 103, using a co-implant process to define a thickness of semiconductor material 105 (which is from a donor substrate) provided within the semiconductor substrate;
4. Join (step 104) the implanted surface region of the semiconductor substrate to a handle substrate 106, e.g., dielectric, conductor, insulator, semiconductor, semi-insulator, semi-metal;
5. Perform a thermal process on the further anneal the handle substrate to the thickness of the semiconductor material;
6. Initiate a controlled cleaving action at a portion of the cleave plane to detach the thickness of semiconductor material 105 from the substrate, while the thickness of semiconductor material remains joined to the handle substrate 106;
7. Cause formation of an edge region having a edge profile that is suitable for being free from generation of particulate contamination;
8. Perform a smoothing process on the detached thickness of material;
9. Process (step 111) the handle substrate with the thickness of semiconductor material using one or more processes to form at least one device 113 (for example, integrated device) onto a portion of the thickness of semiconductor material, while the thickness of semiconductor material remains joined to the handle substrate;
10. Perform other steps, as desired; and
11. Stop.

The above sequence of steps provides a method according to an embodiment of the present invention. As shown, the method uses a combination of steps including a way of forming a thickness of material overlying a handle substrate. The thickness of material can be subjected to further processing depending on the embodiment. In a specific embodiment, handle substrates is a thin substrate that preferably remains on the thickness of material throughout the processing. In a preferred embodiment, the co-implanting process facilitates an edge profile characterized by being free from one or more particles derived from one or more portions of the thickness of material capable of being broken off and causing a defect. The one or more particles having a dimension of greater than about 0.1 micron according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 6 illustrate a simplified method for manufacturing integrated circuits on a layer transferred substrate according to embodiments of the present invention. These diagrams are merely illustrations that should not unduly limit the scope of the claims herein. One of ordinary skill in the art would recognize other variations, modifications, and alternatives. As shown, the method includes providing a semiconductor substrate 200, e.g., silicon, germanium, a silicon-germanium alloy, silicon carbide, gallium nitride, gallium arsenide, any Group III/V materials, any Group II/VI materials, other alloys, and combinations, and others. In a specific embodiment, the semiconductor substrate can be made of a single homogenous material, or a combination of various layers, depending upon the specific embodiment. For example, a dielectric layer such as a silicon oxide layer can be present on the surface 207 in a specific embodiment. Of course, there can be other variations, modifications, and alternatives.

Figure 2:
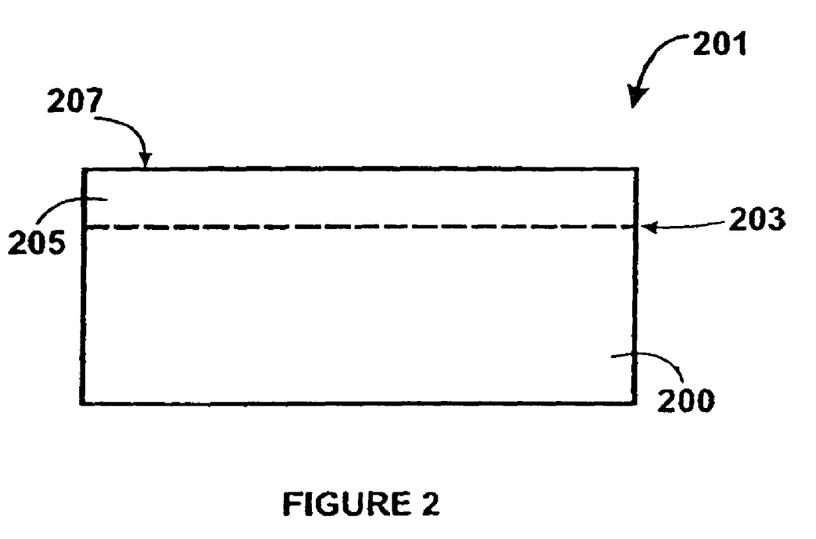
FIGS. 2 through 6 illustrate a simplified method for manufacturing integrated circuits on a layer transferred substrate using co-implantation according to embodiments of the present invention.

In a preferred embodiment, the substrate 201 has a thickness of semiconductor material 205 and a surface region 207. In a specific embodiment, the substrate also has a cleave plane 203 comprising a plurality of particles that have been co-implanted provided within the substrate, which defines the thickness of semiconductor material. In a preferred embodiment, the cleave plane is made using a co-implant process of a helium implant follow by a hydrogen implant at the same or slightly shallower depth, although there may be some variations. Of course, there can be other variations, modifications, and alternatives.

Depending upon the embodiment, the cleave region can be formed using a variety of techniques. That is, the cleave region can be formed using any suitable combination of co-implanted particles. In a specific embodiment, the method introduces certain energetic particles using a co-implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about ±0.001 to ±0.005 microns. Of course, the type of ion used and process conditions depend upon the application.

In a specific embodiment, the implanted particles may be a combination of a plurality of first particles and a plurality of second particles. Preferably the plurality of first particles and a plurality of second particles are light atomic mass particles. Such particles may include ions, molecular species, or atomic species, or a combination thereof. The particles generally have sufficient kinetic energy to penetrate through the surface to the selected depth underneath the surface. Implantation may be a co-implantation of plurality of the first particles and plurality of the second particles. Alternatively, implantation may be provided in sequence, that is, a first implantation using the plurality of first particles is followed by a second implantation using the plurality of second particles. Of course, there can be other variations, modifications, and alternatives.

For example, the plurality of first particles may include hydrogen particles and the plurality of second particles may include helium particles. In a specific embodiment, hydrogen particles and helium particles may be co-implanted into a silicon substrate. Hydrogen may be provided at an implant dose ranging from about $10^{15}$ atoms per cm$^2$ to about $10^{18}$ atoms per cm$^2$ and preferably at about $10^{16}$ atoms per cm$^2$. Helium may be provided at an implant dose ranging from about $10^{15}$ atoms per cm$^2$ to about $10^{18}$ atoms per cm$^2$ and preferably at about $10^{16}$ atoms per cm$^2$. In a specific embodiment, hydrogen particles may be provided at a fraction ranging from about 0.3 to about 0.8 of a total dose of hydrogen and helium. In a preferred embodiment, the fraction of hydrogen is 0.63 of a total dose of hydrogen and helium, but can be others.

Alternatively, a sequential implantation may be performed. For example, the first implantation can use helium particles provided at a does ranging from about $10^{15}$ atoms per cm$^2$ to about $10^{18}$ atoms per cm$^2$ and preferably at about $10^{16}$ atoms per cm$^2$. The first implantation may be provided at a first implant energy ranging from about 1 keV to about 1 MeV and preferably at about 30 keV. The second implantation can use hydrogen particles at a dose ranging from $10^{15}$ atoms per cm$^2$ to about $10^{18}$ atoms per cm$^2$ and preferably at about $10^{16}$ atoms per cm$^2$. The second implantation may be provided at a second implant energy ranging from about 1 keV to about 1 MeV and preferably at about 45 keV. Implantation temperature may ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen particles can be selectively introduced into the silicon wafer to the selected depth at an accuracy of about ±0.001 to ±0.005 microns.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Figure 3:
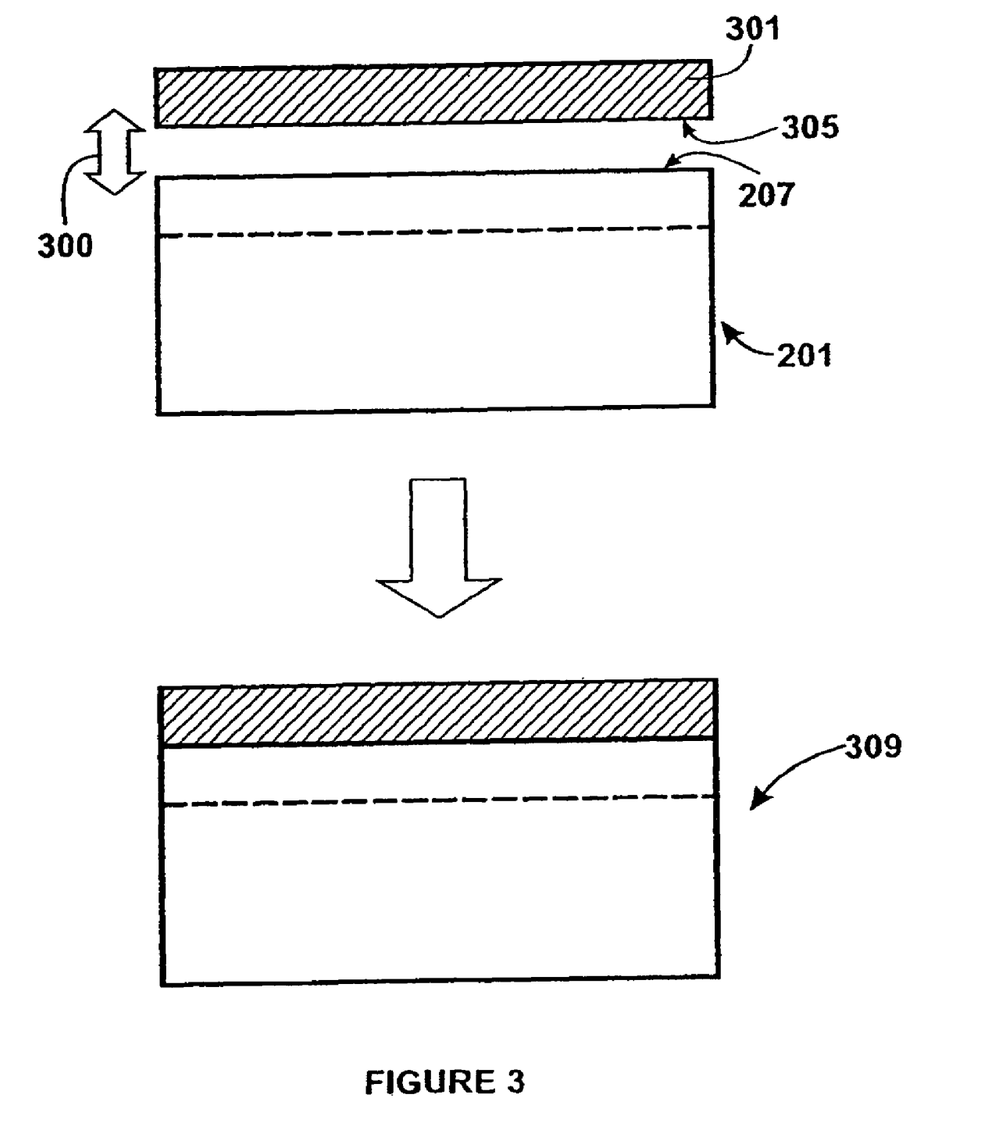

Referring now to FIG. 3, the method includes joining 300 the surface region of the semiconductor substrate to a handle substrate 301. In a specific embodiment, the handle substrate is made of a suitable material that remains fixed to the thickness of material, but can also be selectively and/or easily removed from a substrate, which will be described in more detail below. That is, the handle substrate can be made of a thin layer of silicon or the same type of material as the thickness of semiconductor material, which may be layer transferred. The thin layer can be a single homogeneous material, multiple materials, or any combination of these. The handle substrate is a silicon substrate according to a specific embodiment. In this embodiment, the handle substrate can be attached to the thickness of material using an oxide interface layer which can act as an etch stop in the eventual thinning or removal of the handle substrate. In a specific embodiment, the handle substrate can be a silicon substrate having a thickness of 300 microns and less, but can also be other thickness. In a preferred embodiment, the semiconductor substrate and the handle substrate are joined with a bond strength ranging from about 500 to over 2,000 milli-Joules per square meter. The specific bond energy is chosen such that the resulting bond strength is sufficiently high to allow for the controlled cleaving action to cleave the thickness of semiconductor material 205 onto the handle substrate 301. Of course, there can be other handle substrate material such as ceramic or polysilicon substrates depending upon the specific embodiment. Certain desired considerations for suitability of a material as the handle substrate is the difference in thermal expansion coefficient, cost, and availability according to a specific embodiment. In a preferred embodiment, the handle substrate is silicon material, but can be other materials as well.

In a preferred embodiment, the handle substrate has a surface region 305, which will be joined and/or bonded with surface region 207 provided on substrate 201 to form a coupled substrate structure 309. Like reference numerals are used in this figure has others, but are not intended to be limiting the scope of the claims herein. Further details of the joining process can be found throughout the present specification and more particularly below.

Before joining, the surface regions of the material from the semiconductor substrate and the handle substrate surfaces are each subjected to a cleaning solution to treat the surfaces of the substrates or to clean the substrate surface regions according to a specific embodiment. An example of a solution used to clean the substrate and handle surfaces is a mixture of hydrogen peroxide and sulfuric acid, and other like solutions. A drying process may be performed to dry the semiconductor substrate and handle surfaces to remove any residual liquids and/or particles from the substrate surfaces. Self-bonding occurs by placing surfaces of cleaned substrates (e.g., semiconductor substrate surface and handle substrate surface) together after an optional plasma activation process depending on the specific layer-transfer process used. If desired, such plasma activated processes clean and/or activate the surfaces of the substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together according to a specific embodiment. The substrates are preferably bonded using an EVG 850 bonding tool manufactured by Electronic Vision Group or other like processes for substrate sizes such as 200 mm or 300 mm diameter wafers. Other types of tools such as those manufactured by SUSS MicroTec of Germany may also be used. Of course, there can be other variations, modifications, and alternatives. Preferably, bonding between the handle substrates is substantially permanent and has good reliability through an entirety of the semiconductor processing steps.

Accordingly after bonding, the coupled substrate structures are subjected to a bake treatment according to a specific embodiment. The bake treatment maintains the bonded/coupled substrate at a predetermined temperature and predetermined time. Preferably, the temperature ranges from about 200 or 250 Degrees Celsius to about 400 Degrees Celsius and is preferably about 350 Degrees Celsius for about 1 hour or so for a silicon donor substrate and the handle substrate to attach themselves to each other permanently according to the preferred embodiment. Depending upon the specific application, there can be other variations, modifications, and alternatives. Depending upon the embodiment, the bake process may be optional.

In a specific embodiment, the substrates are joined or fused together using a low temperature thermal step. In a specific embodiment, the low temperature bonding process occurs by a self-bonding process. Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor substrate surface regions to the handle substrate. For instance, an electro-static bonding (e.g., anodic) technique can be used to join the two substrates together. In particular, one or both substrate surface(s) is charged to attract to the other substrate surface. Additionally, the donor substrate surface can be fused to the handle wafer using a variety of other commonly known techniques. Of course, the technique used depends upon the application.

Figure 4:
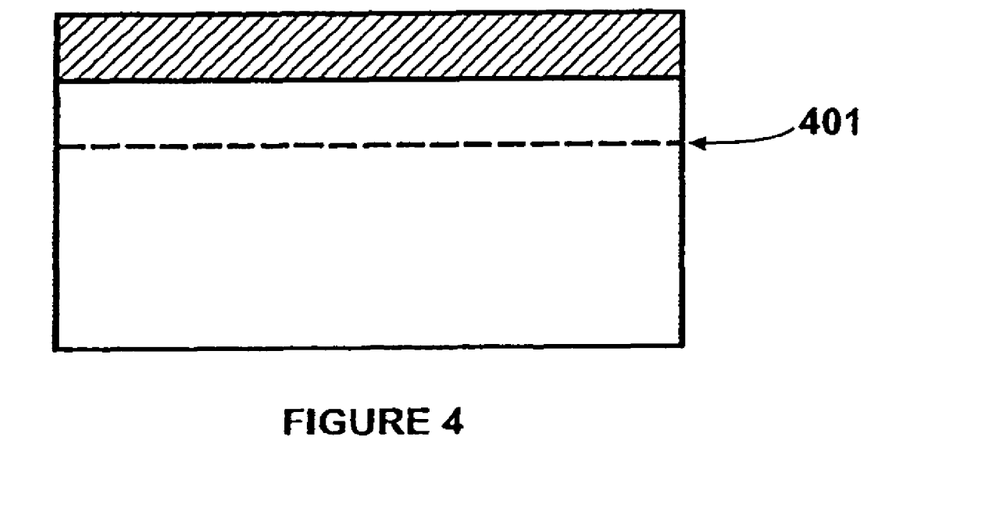

Referring to FIG. 4, the method includes initiating a controlled cleaving action using energy 401 provided at a selected portion of the cleave plane to detach the thickness of semiconductor material from the substrate, while the thickness of semiconductor material remains joined to the handle substrate. Depending upon the specific embodiment, there can be certain variations. For example, the cleaving process can be a controlled cleaving process using a propagating cleave front to selectively free the thickness of material from the donor substrate attached to the handle substrate. Alternative techniques for cleaving can also be used. Such techniques, include, but are not limited to those called a Nanocleave™ process of Silicon Genesis Corporation of San Jose, Calif., a SmartCut™ process of Soitec SA of France, and an Eltran™ process of Canon Inc. of Tokyo, Japan, any like processes, and others. The method then removes the remaining portion of the semiconductor donor substrate, which provided the thickness of material to the handle substrate according to a specific embodiment.

Figure 5:
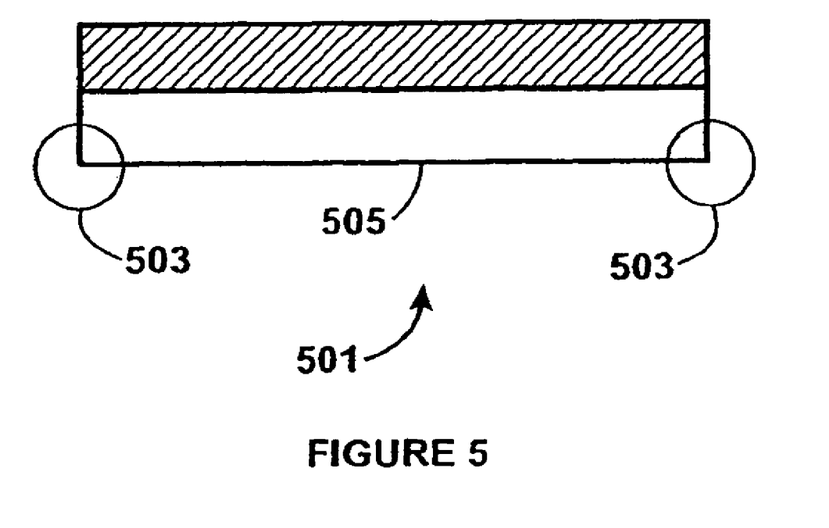

As shown in FIG. 5, after cleaving, the thickness of material includes an exposed surface 501. The exposed surface includes an edge region 503 and an inner region 505. In a specific embodiment, the edge region is characterized by a first surface roughness and the inner region is characterized by a second surface roughness. In a specific embodiment, the edge region can include a portion of the inner region and can be the same roughness of the inner region. Depending upon the embodiment, the roughness may become progressively rougher near an outer portion of the edge region, although it may also be smoother in other embodiments. In a specific embodiment, the first roughness is less than the second roughness, that is, the edge region has a smoother surface than the inner region in a specific embodiment. In a specific embodiment, the surface roughness can be derived from one or more particles derived from one or more portions of the thickness of material. In a specific embodiment, the edge region has an edge profile characterized by being free from one or more particles derived from one or more portions of the thickness of material capable of being broken off and causing a defect. The one or more particles having a dimension of greater than about 0.1 micron according to a specific embodiment. Of course there can be other modifications, variations, and alternatives.

Taking silicon as the donor substrate as an example. In a specific embodiment, the donor substrate is a single crystal silicon wafer. Before implantation, the surface region of the donor substrate may be treated using an activation process. Such activation process can use for example argon or nitrogen plasma. The activation process may also use an oxidizing plasma to activate the surface and to remove surface contaminants. In a specific embodiment, the surface region is activated using an oxygen plasma provided at a pressure at about 50 mtorr to about 360 mtorr for about 5 seconds to about 20 seconds. In a specific embodiment, the cleave plane may be formed using implantation of hydrogen particles, or a combination of helium particles and hydrogen particles depending on the application. In a specific embodiment, a hydrogen implant is provided at a $H^+$ dose ranging from about $5 \times 10^{15}$ atoms per $cm^2$ to about $1 \times 10^{16}$ atoms per $cm^2$ resulting in a thickness of silicon material of about 0.1 micron to about 0.2 micron. In an alternative embodiment, a total combine hydrogen and helium dose of about $4.5 \times 10^{16}$ atoms per $cm^2$ and a hydrogen dose fraction of about 0.63 for implantation is used resulting in a thickness of silicon material having a thickness ranging from about 0.18 micron to about 0.25 micron.

After implantation and formation of the cleave plane, the surface region of the silicon donor substrate is bonded to a suitable handle substrate. The handle substrate can be a silicon material (for example, single crystal silicon, polysilicon, multilayer silicon material, and others). Bonding can occur using a bonding tool, for example, manufactured by Electronic Vision Group at a bonding pressure ranging from about 30 mbar to about 55 mbar for area substrates (for example, 300 mm or less). In a specific embodiment, the bonded substrates are subjected to a bake treatment to allow the silicon substrate to increase a bond strength between the silicon substrate and the handle substrate. The bake treatment can be provided at a temperature ranging from about 200 Degree Celsius to about 400 Degree Celsius for about 30 minutes to about two hours depending on the embodiment.

Thereafter, the bonded substrate is subjected to a cleaving process to separate the thickness of material from the silicon substrate while the thickness of material remains attached to the handle substrate. The cleaving process can be a controlled cleaving process from a initial cleave front to selectively separate the thickness of silicon material from the silicon substrate, the thickness of silicon material remained attached to the handle substrate. The exposed surface of the thickness of material after cleaving is characterized by an edge region having an edge profile characterized by being free from one or more particles derived from one or more portions of the thickness of material capable of being broken off and causing a defect. The one or more particles having a dimension of greater than about 0.1 micron according to a specific embodiment. Of course there can be other modifications, variations, and alternatives.

In a specific embodiment, the resulting handle substrates and thickness of material have suitable characteristics for undergoing one or more processing steps. That is, the handle substrates can be subjected to conventional semiconductor processing techniques, including but not limited to, photolithography, etching, implanting, thermal annealing, chemical mechanical polishing, diffusion, deposition, and other others, which may be known by one of ordinary skill in the art.

Figure 6:
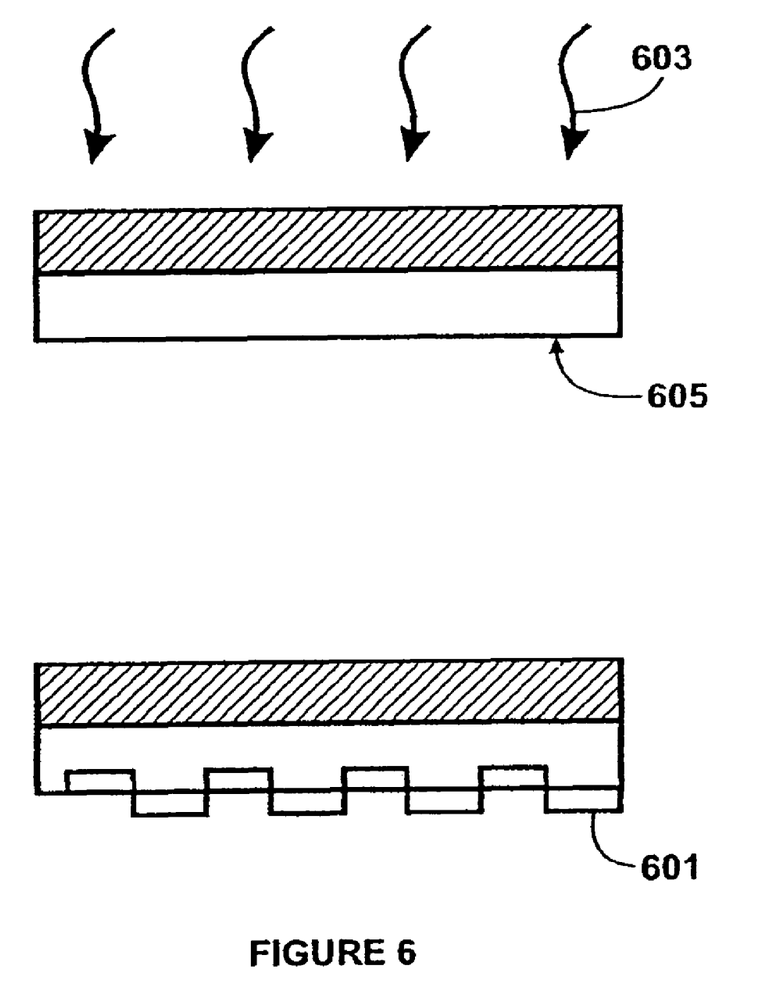

Referring to FIG. 6, the present method performs other processes on portions of the thickness of semiconductor material, which has been attached to the handle substrate. The method forms one or more devices 601 on one or more portions of the thin film of material overlying the handle substrate surface. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel display devices (e.g., LCD, AMLCD), biological and biomedical devices, and the like. Such devices can be made using deposition, etching, implantation, photo masking processes, any combination of these, and the like. Of course, there can be other variations, modifications, and alternatives. Additionally, other steps can also be formed, as desired.

In a preferred embodiment, the processing includes high temperature semiconductor processing techniques 603 to form conventional integrated circuits thereon. The method forms a planarized surface region 605 overlying the thickness of semiconductor material. In a specific embodiment, the planarized surface region can be formed using one or more suitable techniques. Such techniques include deposition of a dielectric layer, which is later reflowed using thermal treatment. The planarized surface region can also be formed using a chemical mechanical polishing process including a suitable slurry, pad, and process according to a specific embodiment. The planarized surface region can also be formed using any combination of these techniques and others according to a specific embodiment. The planarized surface region preferably has a uniformity of about 0.1% to about 5% end to end, and is within about 15 Angstroms RMS in roughness as measured on a 2 micron by 2 micron atomic-force microscope scan. Of course, there can be other variations, modifications, and alternatives. As an example, we have prepared our samples in accordance to the recipes provided below.

EXAMPLES

To prove the operation of the present invention, we prepared samples, which should not unduly limit the scope of the claims herein. In this example, we prepared standard silicon donor wafers using a hydrogen implant and compared it against a co-implanted split lot, which were prepared according to the following recipes.

Materials:
1. Donors Single Crystal Silicon Wafer from Wacker Siltronic P type
2. Donors having 1 kÅ thermal oxide on surfaces of donors Prepare Cleave Plane Using Hydrogen Implant Only—Dose Description:
1. Axcelis (GSD) Implanter H2+ doses 2.6E16H2+/cm^2× (1.35 correction to NRA metrology)×2(H2+ to H+)=7.02 e 16 H+/cm^2 dose 1st Group Implant Energy
1. 34 kev per H2+ species equivalent to 17 keV per H implant atom resulting in an as cleaved silicon thickness of 1575 Å

2nd Group Implant Energy
1. 69 keV per H2+ species equivalent to 34.5 keV per H implant atom resulting in an as cleaved silicon thickness of 3000 Å

Prepare Cleave Plane Using Hydrogen & Helium Co-Implant—Dose Description:

0.63H fraction of 4.3e16 total ion Hydrogen (2.7e16) plus Helium (1.6e16) species dose Implant order, dose and energy
1. He implanted first to 1.6e16/cm^2 @ 31 keV followed by
2. Axcelis GSD Implanter H2+ to 1e16 (NRA equivalent to 1.35e16) @ 44 keV equivalent to 2.7e16H+ @ 22 keV
3. Resulting in 2050 Å as-cleaved layer transfer thickness In a specific embodiment, the present method uses a co-implant process that introduces helium followed by hydrogen. The co-implant process provides a slightly shallower implant for hydrogen according to a specific embodiment. The shallower implant or same depth implant can be within about 20 Angstroms to form the cleave region according to a specific embodiment. As shown, the present co-implant process uses a lower total dose of hydrogen and helium of about $5 \times 10^{16}$ particles/cm$^2$ and a hydrogen dose fraction of about 0.3 to about 0.8 relative to a total fraction according to a specific embodiment. Of course, there can be other variations, modifications, and alternatives.

In a specific embodiment, the present method can use other processes such as plasma activation before bonding. Bonding follows the plasma activation process. In a preferred embodiment, the bonded structure is subjected to a thermal process. In a preferred embodiment, the method uses a controlled cleaving process using a cleaving chamber and knife edge. Of course, there can be other variations, modifications, and alternatives.

Figure 7:
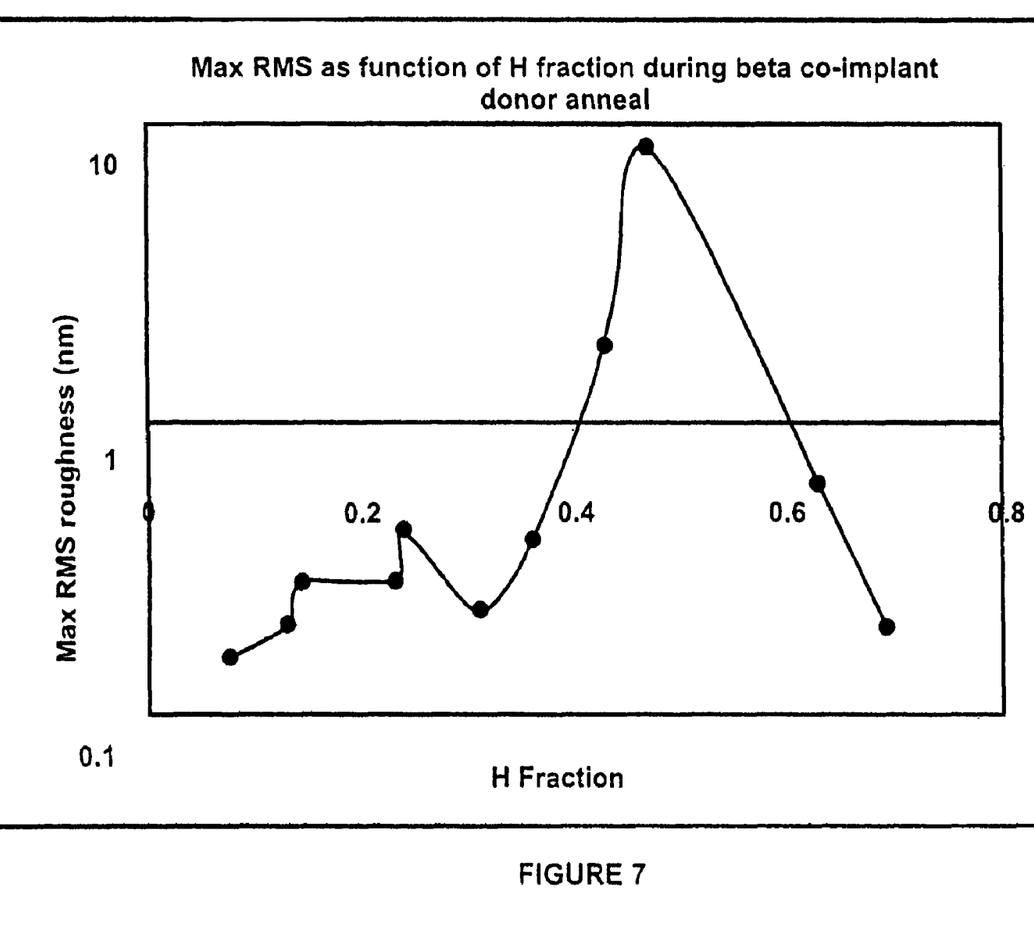
FIGS. 7 through 11 illustrate examples of experiments provided using methods according to embodiments of the present invention.

We also discovered a method and resulting structure using H/He co-implanted donors to control edge quality of SOI wafers and to provide annealed layer transferred processes, as described throughout the present specification and more particularly below. It has been known for some time that the strain effect associated with co-implanting H and He is greater than the implantation of comparable doses of either species alone, see for example *Agarwal, Appl. Phys. Lett.* vol 72 no. 9 p. 1086 (1998). We have been able to advantageously incorporate this effect into our present processes. In a specific embodiment, a result is a reduction in the total H plus He dose required for mechanical cleaving. Another more surprising and less known result is a suppression of the elastic strain associated with donor blistering, which may be undesirable in some embodiments. Typically donor wafers that are implanted with a gas will dramatically roughen when annealed; however the degree of roughening is found to vary significantly according to the ratio of H and He An example is shown in FIG. 7, donors that are unbonded will show a local maximum in roughness as measured by AFM.

Figure 8:
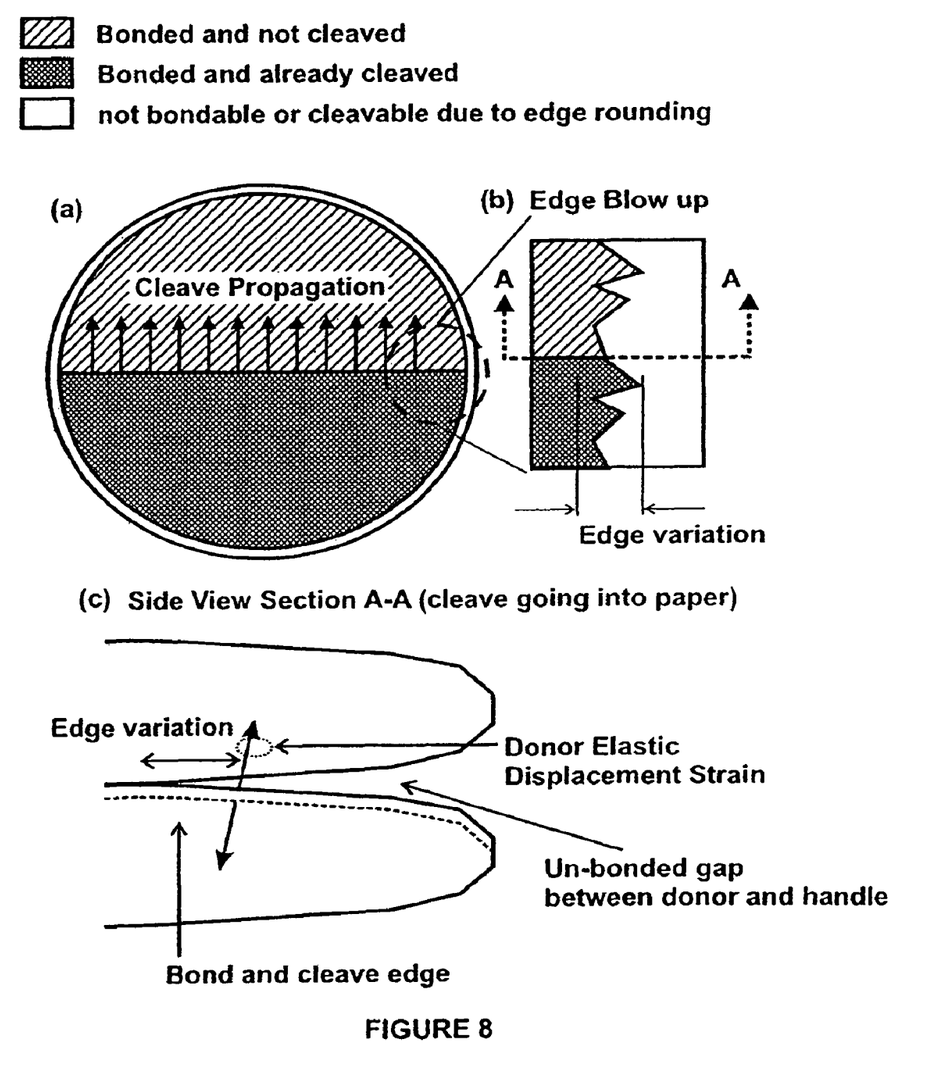

The reason that there would be a relationship between un-bonded donor roughening and the edge shape of a transferred wafer is related to the origin of the transferred edge itself. As shown in FIG. 8, a bonded donor-handle bonded pair will consist of three regions under the cleave process: i) a bonded portion that is not yet cleaved, ii) a bonded portion that has already cleaved and transferred a layer from the donor to the handle and iii) a portion that is on the rounded edge of the two wafers which cannot bond or cleave. One way to interpret the data in FIG. 7 is to view the roughening on unbonded donor material as an elastic deformation of the near surface material. Right on the boundary of the bonded and unbonded regions the normal component of the elastic deformation is working to either reduce or add to the distance between the donor and handle (positive or negative surface deformation). Since the distance is zero at the boundary, an increase in the distance (negative surface deformation strain) will move the boundary inward towards the bonded area while a decrease in the distance (positive surface deformation) will move the boundary outwards. As the cleave progresses and the cleave front at the edge moves past regions of positive and negative elastic surface strains, the cleave/bond edge will vary. The result is a variation in the position and shape of the edge of the transferred layer. The magnitude of the cleave edge variation is defined herein as the edge raggedness. Obviously, if we decrease the donor roughening, we decrease the positive and negative donor surface elastic deformations and therefore the edge raggedness decreases. If we compare the roughening observed for the various co-implant H and He ratios shown in FIG. 7, (well below 10 Å) with the roughening typically observed in H only implants (50-70 Å) we see that co-implant offers a considerable opportunity to control edge raggedness. Of course, there can be other variations, modifications, and alternatives.

Specific Co-Implant Conditions for a Preferred Embodiment

Highlights: Co-Implant SOI Process Sequence

1 Thermal Oxide 1000 Å

2 He implant at 31 keV at a dose of 1.6e16 He atoms/cm^2

3 H2+ implant at 44 keV to a dose of 2.7e16 H atoms/cm^2

4 Plasma Activate (PA) bond using O2 plasma or equivalent

5 Bond treatment anneal

6 Mechanical Cleave

7 High temperature anneal 1050 to 1100° C. (optional)

8 Gas Phase smoothing (nanosmooth) 1050 to 1100° C. ~800 Å

Example of Definition of Edge Raggedness

Figure 9:
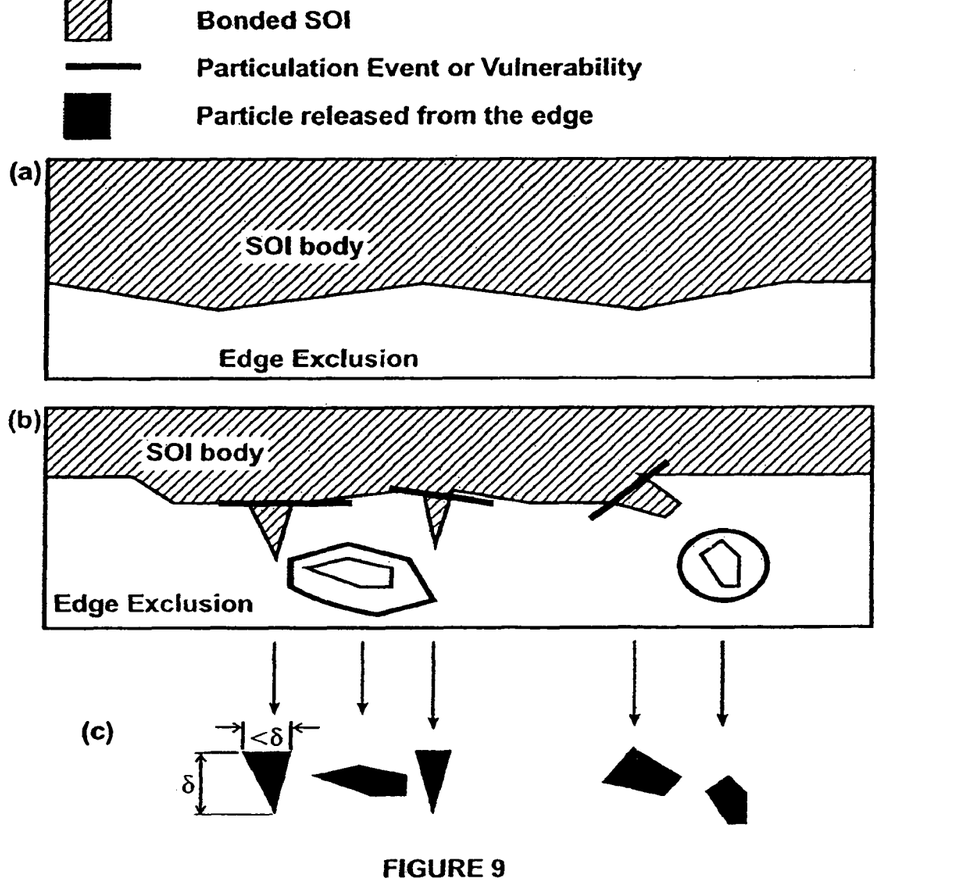
Figure 10:
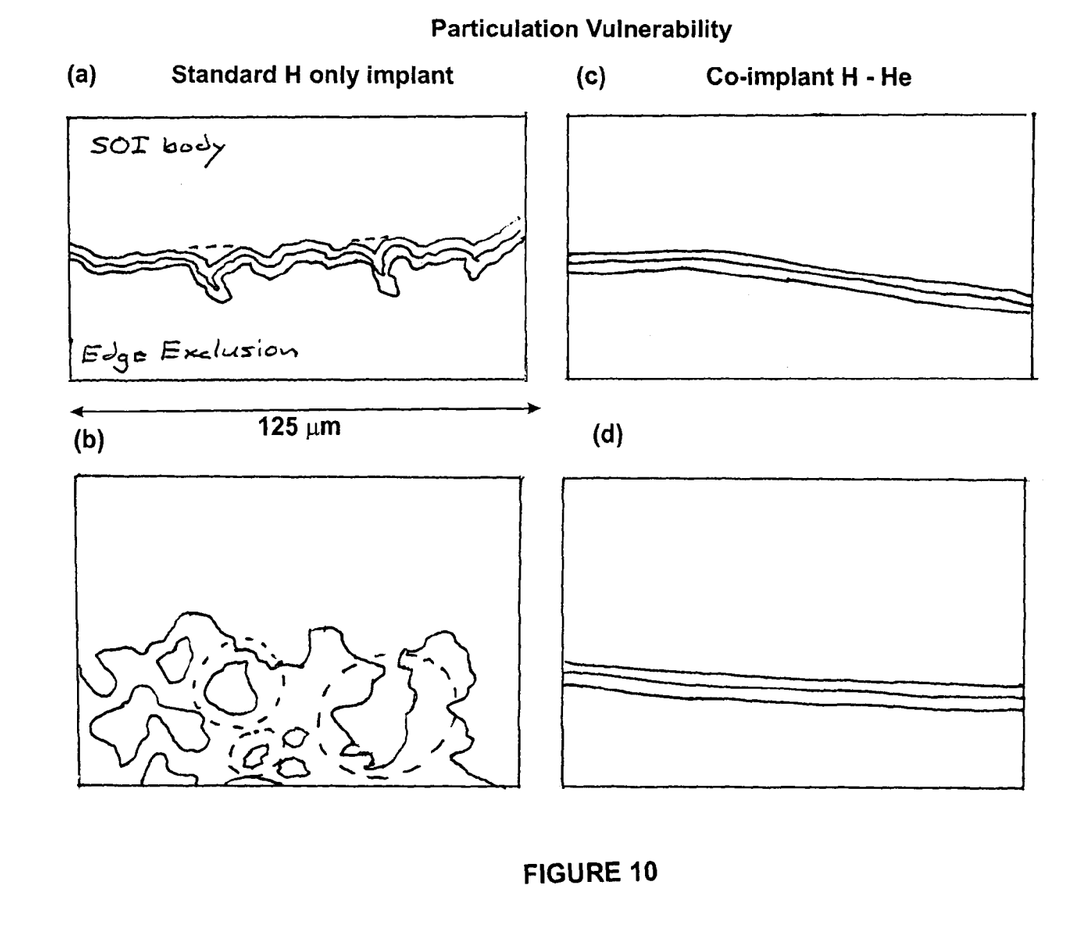

To arrive at a precise definition of edge raggedness presents somewhat of a mathematical problem due to the fractal nature of any real edge; however, the problem can be overcome in a straightforward manner, if we think of the edge in terms of its vulnerability to particulation. By this it is meant that a very ragged edge will be defined as one that is especially vulnerable to having particles detach and release. Such released particles are problematic because they can float in ambient fluids such as cleaning solutions or process gases until they re-attach or re-bond to the device wafer. Re-bonded particles larger than 5 to 10 μm in size are one potential source of what are sometimes call "large area defects" or area defects. Particles smaller than 1 to 5 μm are sometimes called "light point defects (lpd's). A part of the SOI or transferred layer edge region having its maximum dimension, δ, between 0.1 and 50 microns will be defined herein as problematic. We say that an edge portion of the transferred layer or SOI is a "particulation vulnerability" if it can potentially break free from the main portion of the SOI or transferred layer by cutting a short straight line segment less than the critical dimension 8. The concept of an edge portion that meets this definition of an edge particulation vulnerability is illustrated in FIG. 9. As shown in the illustration, an edge particulation vulnerability may consist of an island of transferred material that is not connected at all to the main body of the SOI or transferred layer or it may consist of a region that is connected by a short line segment. The portion does not necessarily detach from the substrate; therefore, it is called a particulation vulnerability. The probability of particulation will, of course, be process dependent Specific examples of particulation vulnerabilities which can be identified on real edges of SOI wafers made by H only implant and co-implant are illustrated in FIG. 10. Note the worst case is illustrated in (b) of FIG. 10; however, less severe cases such as shown in (a) of FIG. 10 are much more common and perhaps equally as problematic.

Figure 11:
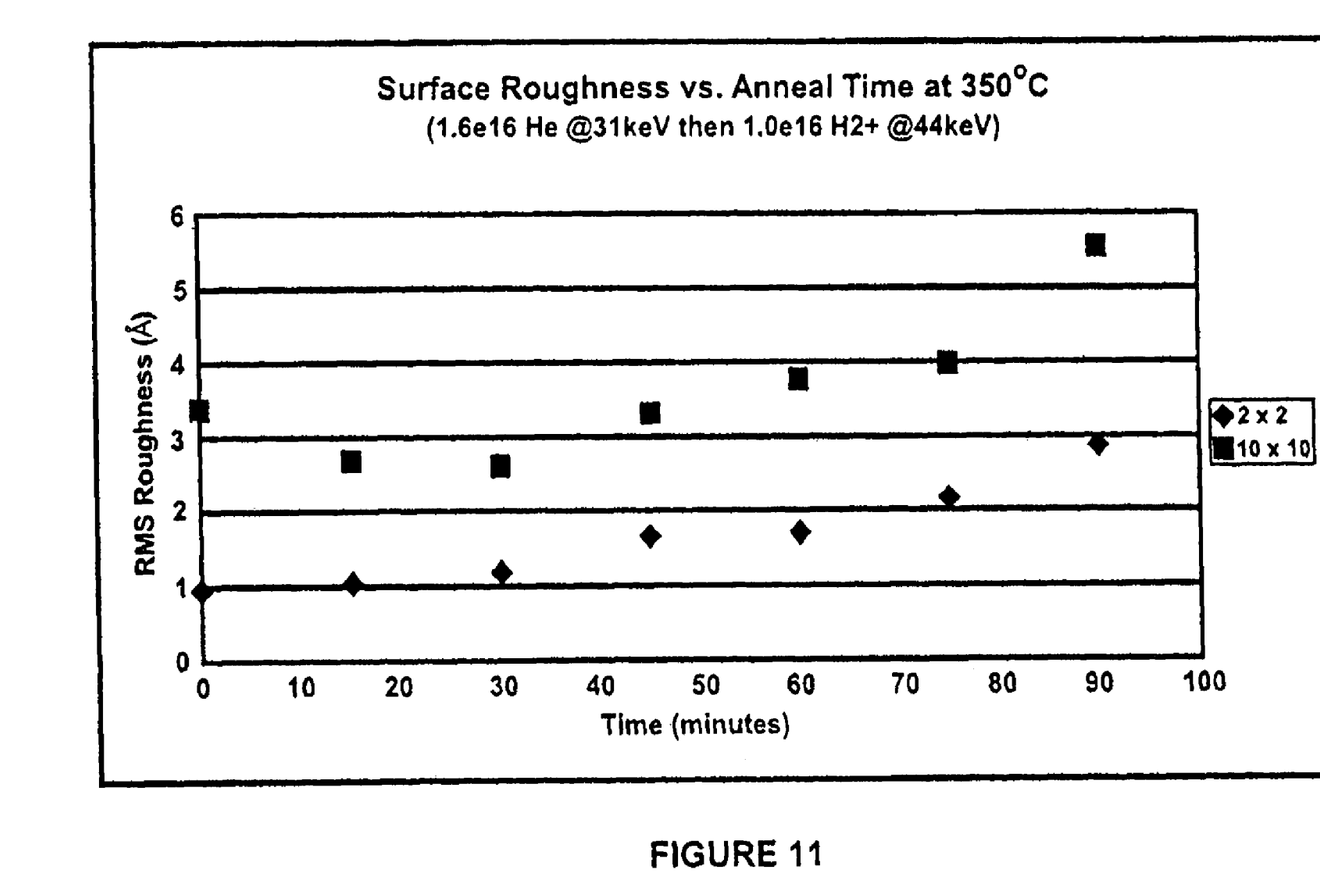

During the initial investigation of the co-implant of $H_2^+$ and He (see previous work), data were collected comparing wafer surface roughness (AFM) to time of anneal of unconstrained implanted wafers. FIG. 11 shows the roughness versus anneal time at 350° C. for our first successful implant condition (He first @ 31 keV with a dose of (1.6e16 uncorrected relative to NRA standard) followed by $H_2^+$ @ 44 keV with a dose of 1.0e16 (uncorrected relative to NRA standard)). The initial test wafers cleaved with a bond anneal of a suitable temperature and time. Based on the roughness data, the unconstrained donor surface was still bondable after one hour of anneal. It was proposed to attempt a beta anneal (anneal prior to bonding) on wafers with the implant condition. The wafers were beta annealed for a suitable time and temperature. The wafers were then bonded with the standard conditions. A post bond anneal (BT) of a suitable time and temperature was also performed. The layer transfer was successful, thus proving the beta anneal concept. This result was later repeated for confirmation.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating a silicon on substrate structure having smooth edge regions, the method comprising:

providing a silicon donor substrate, the silicon donor substrate having a surface region and a backside region, a substrate thickness being provided between the surface region and the backside region;

co-implanting a plurality of first particles having a first dose through the surface region into a vicinity of a cleave region and a plurality of second particles having a second dose through the surface region into the vicinity of the cleave region to define a thickness of material to be removed between the cleave region and the surface region, the first dose and the second dose cumulating to a total dose and a dose fraction, the dose fraction between the first particles relative to the total dose;

joining the surface region of the silicon donor substrate to a handle substrate to form a coupled substrate structure;

processing the coupled substrate structure using a thermal treatment process;

placing the coupled substrate structure into a cleaving chamber;

initiating a cleaving action at an edge region of the coupled substrate structure to begin to detach the thickness of material at the edge region toward a center region of the thickness of material;

removing the thickness of material to free the thickness of material from a remaining portion of the coupled substrate structure to form an edge region of the thickness of material having an edge profile characterized by being free from one or more particles derived from one or more portions of the thickness of material capable of being broken off and causing a defect, the one or more particles having a dimension of greater than about 0.1 micron according to a specific embodiment.

2. The method of claim 1 wherein the first particles comprise hydrogen particles and the second particles comprise helium particles.

3. The method of claim 1 wherein the first particles comprise hydrogen particles and the second particles comprise helium particles; wherein the first particles and the second particles are provided at the dose fraction ranging from about 0.3 to 0.8.

4. The method of claim 1 wherein the processing of the coupled substrate structure comprises at least a thermal treatment process to cause the coupled substrates to be attached permanently.

5. The method of claim 1 wherein the handle substrate is selected from silicon.

6. The method of claim 1 wherein the edge region is derived from a cleave region having silicon.

7. The method of claim 1 wherein the co-implant process comprises a sequential implant process.

8. The method of claim 1 wherein the co-implant process comprises a concurrent implant process.

9. The method of claim 1 wherein the co-implant process comprises a (1) helium species implant process at a first depth followed by (2) a hydrogen species implant at the same depth or shallower depth within about 20 Angstroms to form the cleave region.

10. The method of claim 1 wherein the co-implant process comprises a (1) hydrogen species implant at a first depth followed by (2) a helium species implant at the same depth or shallower depth within about 20 Angstroms to form the cleave region.

11. The method of claim 1 wherein the cleave region is subjected to a thermal treatment process that is free from formation of microcavities.

12. The method of claim 1 further comprising a plasma activation process to the surface region before joining the surface region to the handle substrate.

13. A method for fabricating a silicon on substrate structure having smooth edge regions, the method comprising:

provoding a silicon donor substrate, the silicon donor substrate having a surface region and a backside region, a substrate thickness being provided between the surface region and the backside region;

co-implanting a plurality of first particles through the surface region into a vicinity of a cleave region and a plurality of second particles through the surface region into the vicinity of the cleave region to define a thickness of material to be removed between the cleave region and the surface region;

joining the surface region of the silicon donor substrate to a handle substrate to form a coupled substrate structure;

processing the coupled substrate structure using a thermal treatment process;

placing the coupled substrate structure into a cleaving chamber;

initiating a cleaving action at an edge region of the coupled substrate structure to begin to detach the thickness of material at the edge region toward a center region of the thickness of material;

removing the thickness of material to free the thickness of material from a remaining portion of the coupled substrate structure; and providing an edge region of the thickness of material having an edge profile characterized by being free from one or more particles derived from one or more portions of the thickness of material capable of being broken off and causing a defect, the one or more particles having a dimension of greater than about 0.1 micron according to a specific embodiment.

14. The method of claim 13 wherein the first particles comprise hydrogen particles and the second particles comprise helium particles.

15. The method of claim 13 wherein the first particles comprise hydrogen particles and the second particles comprise helium particles; wherein the first particles and the second particles are provided at a dose ratio ranging from about 0.3 to 0.8.

16. The method of claim 13 wherein the processing of the coupled substrate structure comprises at least a thermal treatment process to cause the coupled substrates to be attached permanently.

17. The method of claim 13 wherein the handle substrate is selected from silicon.

18. The method of claim 13 wherein the edge region is derived from a cleave region having silicon.

19. The method of claim 13 wherein the co-implant process comprises a sequential implant process.

20. The method of claim 13 wherein the co-implant process comprises a concurrent implant process.

21. The method of claim 13 wherein the co-implant process comprises a (1) helium species implant process at a first depth followed by (2) a hydrogen species implant at the same depth or shallower depth within about 20 Angstroms to form the cleave region.

22. The method of claim 13 wherein the co-implant process comprises a (1) hydrogen species implant at a first depth followed by (2) a helium species implant at the same depth or shallower depth within about 20 Angstroms to form the cleave region.

23. The method of claim 13 wherein the cleave region is subjected to a thermal treatment process that is free from formation of microcavities.

24. The method of claim 13 further comprising a plasma activation process to the surface region before joining the surface region to the handle substrate.

* * * * *